US010472445B2

(12) United States Patent
Ito et al.

(10) Patent No.: US 10,472,445 B2
(45) Date of Patent: Nov. 12, 2019

(54) PHOTOCURABLE COMPOSITION AND METHOD FOR MANUFACTURING FILM

(71) Applicant: CANON KABUSHIKI KAISHA, Tokyo (JP)

(72) Inventors: Toshiki Ito, Kawasaki (JP); Chieko Mihara, Isehara (JP); Naoko Matsufuji, Yokohama (JP); Kenji Kitagawa, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 406 days.

(21) Appl. No.: 14/433,850

(22) PCT Filed: Sep. 20, 2013

(86) PCT No.: PCT/JP2013/076456
§ 371 (c)(1),
(2) Date: Apr. 6, 2015

(87) PCT Pub. No.: WO2014/057823
PCT Pub. Date: Apr. 17, 2014

(65) Prior Publication Data
US 2015/0252131 A1    Sep. 10, 2015

(30) Foreign Application Priority Data

Oct. 9, 2012 (JP) ................................. 2012-223988

(51) Int. Cl.
*B32B 3/10* (2006.01)
*C08F 222/10* (2006.01)
(Continued)

(52) U.S. Cl.
CPC ............ *C08F 222/10* (2013.01); *B29C 59/16* (2013.01); *B82Y 10/00* (2013.01); *B82Y 40/00* (2013.01);
(Continued)

(58) Field of Classification Search
None
See application file for complete search history.

(56) References Cited

U.S. PATENT DOCUMENTS 9,623,439 B2 *   4/2017   Ito ............................ B05D 3/06

FOREIGN PATENT DOCUMENTS

CN    103907174 A    7/2014
JP    2010103464 A    5/2010
(Continued)

OTHER PUBLICATIONS

Machine translation of JP2011071299 retrieved on Sep. 28, 2017.*
(Continued)

*Primary Examiner* — Christopher M Polley
(74) *Attorney, Agent, or Firm* — Canon U.S.A., Inc. IP Division

(57) ABSTRACT

A photocurable composition which decreases a mold releasing force is provided. The photocurable composition is a photocurable composition which is cured using light while being in contact with a mold having a surface in which a concavo-convex pattern is formed so as to manufacture a film having a concavo-convex pattern and which includes a polymerizable compound, a photopolymerization initiator, and a photosensitive gas generating agent having a photostimulation responsive portion. The photosensitive gas generating agent has a repeating structure containing at least one alkylene oxide chain and generates a gas from the photostimulation responsive portion by light irradiation.

19 Claims, 1 Drawing Sheet

(51) Int. Cl.

| | | |
|---|---|---|
| *C08K 5/435* | (2006.01) | |
| *G03F 7/00* | (2006.01) | |
| *G03F 7/022* | (2006.01) | |
| *G03F 7/027* | (2006.01) | |
| *B82Y 10/00* | (2011.01) | |
| *B82Y 40/00* | (2011.01) | |
| *C08L 33/06* | (2006.01) | |
| *B29C 59/16* | (2006.01) | |
| *C23C 14/48* | (2006.01) | |
| *G02B 1/04* | (2006.01) | |
| *H05K 3/00* | (2006.01) | |
| *H05K 3/06* | (2006.01) | |
| *H01L 21/027* | (2006.01) | |
| *H01L 21/311* | (2006.01) | |
| *C08K 5/23* | (2006.01) | |
| *B29D 11/00* | (2006.01) | |
| *B29L 11/00* | (2006.01) | |

(52) U.S. Cl.
CPC ............. *C08K 5/435* (2013.01); *C08L 33/06* (2013.01); *C23C 14/48* (2013.01); *G02B 1/04* (2013.01); *G03F 7/0002* (2013.01); *G03F 7/022* (2013.01); *G03F 7/027* (2013.01); *H05K 3/0091* (2013.01); *H05K 3/06* (2013.01); *B29D 11/00788* (2013.01); *B29L 2011/00* (2013.01); *C08K 5/235* (2013.01); *H01L 21/0271* (2013.01); *H01L 21/311* (2013.01); *Y10T 428/24802* (2015.01)

(56) References Cited

FOREIGN PATENT DOCUMENTS

| | | | | |
|---|---|---|---|---|
| JP | 2010262980 A | | 11/2010 | |
| JP | 2011-071299 A | | 4/2011 | |
| JP | 2011071299 A | * | 4/2011 | ........... G03F 7/0002 |
| JP | 2013110383 A | | 6/2013 | |
| JP | 2013115197 A | | 6/2013 | |
| WO | 2010005032 A | | 1/2010 | |
| WO | 2013/062068 A1 | | 5/2013 | |
| WO | WO 2013062068 A1 | * | 5/2013 | ............... B05D 3/06 |

OTHER PUBLICATIONS

SPIE, vol. 3676, p. 379.
Journal of the American Chemical Society, vol. 127, p. 9952-9953.

* cited by examiner

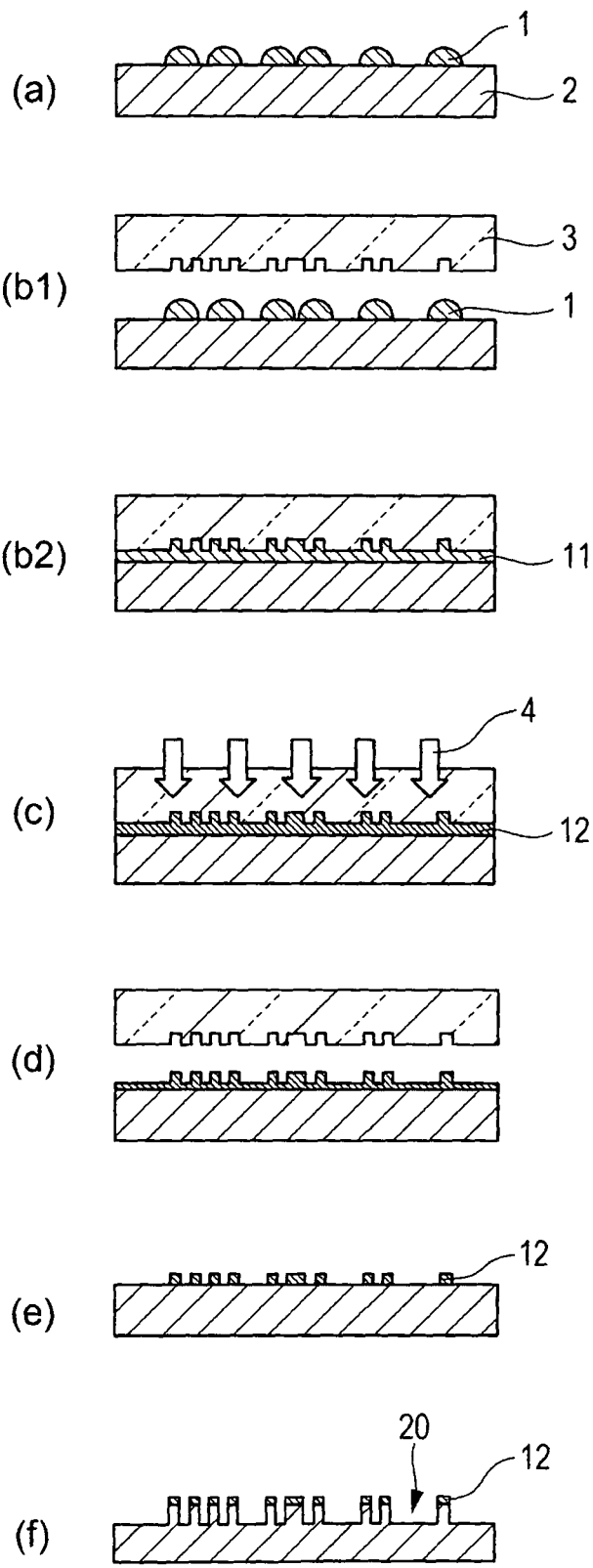

PHOTOCURABLE COMPOSITION AND METHOD FOR MANUFACTURING FILM

TECHNICAL FIELD

The present invention relates to a photocurable composition and a method for manufacturing a film using the photocurable composition.

BACKGROUND ART

A photo-nanoimprint method is one method for forming a resist film having a predetermined pattern shape on a substrate, such as a processing substrate to be processed, and has a manufacturing process including, for example, the following steps (a) to (d) (Non-Patent Literature 1).
(a) an arrangement step of arranging a resist (photocurable composition).
(b) a mold contact step of bringing a mold having a surface in which a fine concavo-convex pattern is formed into contact with the photocurable composition.
(c) a light irradiation step of irradiating the photocurable composition with light.
(d) a mold releasing step of releasing the mold from the photocurable composition after the light irradiation step.

The pattern shape of the resist film formed by the manufacturing process including the above steps (a) to (d) is formed by transferring the concavo-convex pattern of the mold to the resist film arranged on the substrate.

Incidentally, when a photo-nanoimprint method is used, an important subject thereof is to reduce a force, that is, a mold releasing force, required to separate (release) the mold from a resist cured product in the mold releasing step (step (d)). The reason for this is that if the mold releasing force is high, for example, unfavorably, defects may be generated in the pattern, and/or the alignment accuracy may be degraded since the substrate is lifted up from a stage.

In order to solve the problems described above, Patent Literature 1 has proposed a method using a photocurable composition containing a photosensitive gas generating agent which generates a gas, such as nitrogen or carbon dioxide, by a photochemical reaction. The method described above is a method in which at the interface between the photocurable composition and a mold, the bond or the molecular interaction therebetween is broken or eliminated by the pressure of the gas generated from the photosensitive gas generating agent in a light irradiation step so as to reduce the mold releasing force.

CITATION LIST

Patent Literature

PTL 1 Japanese Patent Laid-Open No. 2010-262980

Non Patent Literature

NPL 1 SPIE, Vol. 3676, P. 379
NPL 2 Journal of the American Chemical Society, Vol. 127, P. 9952-9953

SUMMARY OF INVENTION

Technical Problem

However, in the method proposed in Patent Literature 1, there has been a problem in that since the light irradiation step of generating a gas takes a long period of time, the productivity is degraded. In addition, even if the photosensitive gas generating agent is added, the mold releasing force generated between the mold and the photocurable composition is still disadvantageously high.

In consideration of the problems described above, the present invention provides a photocurable composition which reduces a mold releasing force. In addition, the present invention also provides a method for manufacturing a film using a photo-imprint method having a high productivity.

Solution to Problem

The photocurable composition of the present invention is a photocurable composition which is cured using light while being in contact with a mold having a surface in which a concavo-convex pattern is formed so as to manufacture a film having a concavo-convex pattern. The photocurable composition of the present invention comprises: a polymerizable compound; a photopolymerization initiator; and a photosensitive gas generating agent having a photostimulation responsive portion. In this photocurable composition of the present invention, the photosensitive gas generating agent has a repeating structure including at least one alkylene oxide chain and generates a gas from the photostimulation responsive portion by light irradiation.

Advantageous Effects of Invention

According to the present invention, a photocurable composition which reduces a mold releasing force can be provided. In addition, according to the present invention, a method for manufacturing a film using a photo-imprint method having a high productivity can also be provided.

Further features of the present invention will become apparent from the following description of exemplary embodiments with reference to the attached drawings.

BRIEF DESCRIPTION OF DRAWINGS

FIG. 1 includes schematic cross-sectional views showing one example of a method for manufacturing a film according to an embodiment of the present invention.

DESCRIPTION OF EMBODIMENTS

Hereinafter, embodiments of the present invention will be described in detail with appropriate reference to the drawings. However, the present invention is not limited to the following embodiments. In addition, appropriate changes, improvements, and the like of the following embodiments performed based on the common knowledge of a person skilled in the art without departing from the scope of the present invention are also considered to be within the scope of the present invention.

In addition, a method for manufacturing a film of the present invention, which will be described later, is for example, a method for forming a film using a photo-imprint method. When a photo-imprint method is used, a method for forming a film having a pattern size of 1 nm to 10 mm is preferable. In addition, a method for forming a film having a pattern size of approximately 10 nm to 100 μm is more preferable. In general, a pattern formation technique for forming a film having a nanosize (1 to 100 nm) pattern (concavo-convex structure) using light is called a photo-nanoimprint method. The present invention uses a photo-nanoimprint method.

Photocurable Composition

A photocurable composition of the present invention is a photocurable composition which is cured using light while being in contact with a mold having a surface in which a concavo-convex pattern is formed so as to manufacture a film having a concavo-convex pattern. In addition, the photocurable composition of the present invention at least includes the following components (A) to (C).

(A) a polymerizable compound
(B) a photopolymerization initiator
(C) a photosensitive gas generating agent In the photocurable composition of the present invention, the photosensitive gas generating agent functioning as the component (C) is a compound having a photostimulation responsive portion and a repeating structure including at least one alkylene oxide chain.

Hereinafter, the individual components will be described in detail.

Polymerizable Compound (Component (A))

As the polymerizable compound forming the photocurable composition of the present invention, a radical polymerizable compound or a cation polymerizable compound may be mentioned by way of example.

As the radical polymerizable compound, a compound having at least one acryloyl group or a methacryloyl group is preferable. As the cation polymerizable compound, a compound having at least one vinyl ether group, an epoxy group, or an oxetanyl group is preferable.

Polymerizable Compound (A) Radical Polymerizable Component

As a monofunctional (meth)acrylic compound having one acryloyl group or methacryloyl group, for example, there may be mentioned phenoxyethyl (meth)acrylate, phenoxy-2-methylethyl (meth) acrylate, phenoxyethoxyethyl (meth) acrylate, 3-phenoxy-2-hydroxypropyl (meth) acrylate, 2-phenylphenoxyethyl (meth) acrylate, 4-phenylphenoxyethyl (meth) acrylate, 3-(2-phenylphenyl)-2-hydroxypropyl (meth)acrylate, (meth)acrylate of EO modified p-cumylphenol, 2-bromophenoxyethyl (meth) acrylate, 2,4-dibromophenoxyethyl (meth)acrylate, 2,4,6-tribromophenoxyethyl (meth)acrylate, EO modified phenoxy (meth)acrylate, PO modified phenoxy (meth) acrylate, polyoxyethylene nonylphenyl ether (meth) acrylate, isobornyl (meth) acrylate, 1-adamanthyl (meth)acrylate, 2-methyl-2-adamanthyl (meth)acrylate, 2-ethyl-2-adamanthyl (meth) acrylate, bornyl (meth) acrylate, tricyclodecanyl (meth) acrylate, dicyclopentenyl (meth) acrylate, dicyclopentenyl (meth) acrylate, cyclohexyl (meth) acrylate, 4-butylcyclohexyl (meth) acrylate, acryloyl morpholine, 2-hydroxyethyl (meth) acrylate, 2-hydroxypropyl (meth) acrylate, 2-hydroxybutyl (meth)acrylate, methyl (meth)acrylate, ethyl (meth)acrylate, propyl (meth)acrylate, isopropyl (meth)acrylate, butyl (meth)acrylate, amyl (meth)acrylate, isobutyl (meth)acrylate, t-butyl (meth)acrylate, pentyl (meth)acrylate, isoamyl (meth)acrylate, hexyl (meth)acrylate, heptyl (meth)acrylate, octyl (meth)acrylate, isooctyl (meth)acrylate, 2-ethylhexyl (meth)acrylate, nonyl (meth)acrylate, decyl (meth)acrylate, isodecyl (meth)acrylate, undecyl (meth)acrylate, dodecyl (meth)acrylate, lauryl (meth)acrylate, stearyl (meth)acrylate, isostearyl (meth)acrylate, benzyl (meth) acrylate, tetrahydrofurfuryl (meth) acrylate, butoxyethyl (meth) acrylate, ethoxydiethylene glycol (meth) acrylate, polyethylene glycol mono(meth)acrylate, polypropylene glycol mono (meth)acrylate, methoxyethylene glycol (meth)acrylate, ethoxyethyl (meth)acrylate, methoxypolyethylene glycol (meth) acrylate, methoxypolypropylene glycol (meth) acrylate, diacetone (meth)acrylamide, isobutoxymethyl (meth) acrylamide, N,N-dimethyl (meth) acrylamide, t-octyl (meth) acrylamide, dimethylaminoethyl (meth) acrylate, diethylaminoethyl (meth)acrylate, 7-amino-3,7-dimethyloctyl (meth) acrylate, N,N-diethyl (meth) acrylamide, and N,N-dimethylaminopropyl (meth)acrylamide; however, the monofunctional (meth)acrylic compound having one acryloyl group or methacryloyl group is not limited to those mentioned above.

As a commercially available product of the monofunctional (meth)acrylic compounds mentioned above, for example, there may be mentioned Aronix M101, M102, M110, M111, M113, M117, M5700, TO-1317, M120, M150, and M156 (manufactured by Toagosei Co., Ltd.); MEDOL10, MIBDOL10, CHDOL10, MMDOL30, MEDOL30, MIBDOL30, CHDOL30, LA, IBXA, 2-MTA, HPA, Biscoat #150, #155, #158, #190, #192, #193, #220, #2000, #2100, and #2150 (manufactured by Osaka Organic Chemical Industry Ltd.); Light Acrylate BO-A, EC-A, DMP-A, THF-A, HOP-A, HOA-MPE, HOA-MPL, PO-A, P-200A, NP-4EA, NP-8EA, and epoxy ester M-600A (manufactured by Kyoei Kagaku Kogyo Co., Ltd.); KAYARAD TC110S, R-564, and R-128H (manufactured by Nippon Kayaku Co., Ltd.); NK ester AMP-10G and AMP-20G (manufactured by Shin Nakamura Chemical Co., Ltd.); FA-511A, 512A, and 513A (manufactured by Hitachi Chemical Company, Ltd.); PHE, CEA, PHE-2, PHE-4, BR-31, BR-31M, and BR-32 (manufactured by Dai-ichi Kogyo Seiyaku Co., Ltd.); VP (manufacture by BASF); and ACMO, DMAA, and DMAPAA (manufactured by Kohjin co., Ltd.). However, the commercially available product of the monofunctional (meth)acrylic compound is not limited to those mentioned above.

As a polyfunctional (meth)acrylic compound having at least two acryloyl groups or methacryloyl groups, for example, there may be mentioned trimethylolpropane di(meth)acrylate, trimethylolpropane tri(meth)acrylate, EO modified trimethylolpropane tri(meth)acrylate, PO modified trimethylolpropane tri(meth)acrylate, EO, PO modified trimethylolpropane tri(meth)acrylate, pentaerythritol tri (meth)acrylate, pentaerythritol tetra(meth)acrylate, ethylene glycol di(meth)acrylate, tetraethylene glycol di(meth)acrylate, polyethylene glycol di(meth)acrylate, polypropylene glycol di(meth)acrylate, 1,4-butanediol di(meth)acrylate, 1,6-hexanediol di(meth)acrylate, neopentyl glycol di(meth) acrylate, tris(2-hydroxy ethyl)isocyanurate tri(meth)acrylate, tris(acryloyloxy)isocyanurate, bis(hydroxymethyl)tricyclodecane di(meth)acrylate, dipentaerythritol penta(meth) acrylate, dipentaerythritol hexa(meth)acrylate, EO modified 2,2-bis(4-(meth)(acryloxy)phenyl)propane, PO modified 2,2-bis(4-(meth)(acryloxy)phenyl)propane, and EO, PO modified 2,2-bis(4-(meth)(acryloxy)phenyl)propane; however, the polyfunctional (meth)acrylic compound having at least two acryloyl groups or methacryloyl groups is not limited to those mentioned above.

As a commercially available product of the polyfunctional (meth)acrylic compounds mentioned above, for example, there may be mentioned Yupimer UV SA1002 and SA2007 (manufactured by Mitsubishi Chemical Corp.); Biscoat #195, #230, #215, #260, #335HP, #295, #300, #360, #700, GPT, and 3PA (manufactured by Osaka Organic Chemical Industry Ltd.); Light Acrylate 4EG-A, 9EG-A, NP-A, DCP-A, BP-4EA, BP-4PA, TMP-A, PE-3A, PE-4A, and DPE-6A (manufactured by Kyoei Kagaku Kogyo Co., Ltd.); KAYARAD PET-30, TMPTA, R-604, DPHA, DPCA-20, -30, -60, -120, HX-620, D-310, and D-330 (manufactured by Nippon Kayaku Co., Ltd.); Aronix M208, M210, M215, M220, M240, M305, M309, M310, M315, M325, and M400 (manufactured by Toagosei Co., Ltd.); and Repokishi VR-77 VR-60, and VR-90 (manufactured by Showa Highpolymer Co., Ltd.); however, the commercially available product of the polyfunctional (meth)acrylic compounds is not limited to those mentioned above.

The radical polymerizable compounds mentioned above may be used alone, or at least two types thereof may be used in combination. In addition, in the compound groups described above, the (meth)acrylate represents an acrylate and a methacrylate corresponding thereto. The (meth)acryloyl group represents an acryloyl group and a methacryloyl group corresponding thereto. EO represents ethylene oxide, and the EO modified compound represents a compound having a block structure of an ethylene oxide group. In addition, PO represents propylene oxide, and the PO modified compound represents a compound having a block structure of a propylene oxide group.

Polymerizable Compound (A) Cation Polymerizable Component

As a compound having one vinyl ether group, for example, there may be mentioned methyl vinyl ether, ethyl vinyl ether, propyl vinyl ether, n-butyl vinyl ether, t-butyl vinyl ether, 2-ethylhexyl vinyl ether, n-nonyl vinyl ether, lauryl vinyl ether, cyclohexyl vinyl ether, cyclohexylmethyl vinyl ether, 4-methylcyclohexylmethyl vinyl ether, benzyl vinyl ether, dicyclopentenyl vinyl ether, 2-dicyclopentenoxyethyl vinyl ether, methoxyethyl vinyl ether, ethoxyethyl vinyl ether, butoxyethyl vinyl ether, methoxyethoxyethyl vinyl ether, ethoxyethoxyethyl vinyl ether, methoxy(polyethylene glycol) vinyl ether, tetrahydrofurfuryl vinyl ether, 2-hydroxyethyl vinyl ether, 2-hydroxypropyl vinyl ether, 4-hydroxybutyl vinyl ether, 4-hydroxymethyl-cyclohexyl-methyl vinyl ether, diethylene glycol monovinyl ether, poly(ethylene glycol) vinyl ether, chloroethyl vinyl ether, chlorobutyl vinyl ether, chloroethoxyethyl vinyl ether, phenylethyl vinyl ether, and phenoxy(polyethylene glycol) vinyl ether; however, the compound having one vinyl ether group is not limited to those mentioned above.

As a compound having at least two vinyl ether groups, for example, there may be mentioned divinyl ethers, such as ethylene glycol divinyl ether, diethylene glycol divinyl ether, polyethylene glycol divinyl ether, propylene glycol divinyl ether, butylene glycol divinyl ether, hexanediol divinyl ether, bisphenol A alkylene oxide divinyl ether, and bisphenol F alkylene oxide divinyl ether; and polyvinyl ethers, such as trimethylolethane trivinyl ether, trimethylolpropane trivinyl ether, ditrimethylolpropane tetravinyl ether, glycerol trivinyl ether, pentaerythritol tetravinyl ether, dipentaerythritol pentavinyl ether, dipentaerythritol hexavinyl ether, ethylene oxide adduct of trimethylolpropane trivinyl ether, propylene oxide adduct of trimethylolpropane trivinyl ether, ethylene oxide adduct of ditrimethylolpropane tetravinyl ether, propylene oxide adduct of ditrimethylolpropane tetravinyl ether, ethylene oxide adduct of pentaerythritol tetravinyl ether, propylene oxide adduct of pentaerythritol tetravinyl ether, ethylene oxide adduct of dipentaerythritol hexavinyl ether, and propylene oxide adduct of dipentaerythritol hexavinyl ether; however, the compound having at least two vinyl ether groups is not limited to those mentioned above.

As a compound having one epoxy group, for example, there may be mentioned phenyl glycidyl ether, p-tert-butylphenyl glycidyl ether, butyl glycidyl ether, 2-ethylhexyl glycidyl ether, allyl glycidyl ether, 1,2-butylene oxide, 1,3-butadiene monoxide, 1,2-epoxy dodecane, epichlorohydrin, 1,2-epoxy decane, styrene oxide, cyclohexene oxide, 3-methacryloyloxymethyl cyclohexene oxide, 3-acryloyloxymethyl cyclohexene oxide, and 3-vinylcyclohexene oxide; however, the compound having one epoxy group is not limited to those mentioned above.

As a compound having at least two epoxy groups, for example, there may be mentioned bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, epoxy novolac resin, hydrogenated bisphenol A diglycidyl ether, hydrogenated bisphenol F diglycidyl ether, hydrogenated bisphenol S diglycidyl ether, 3,4-epoxycyclohexylmethyl-3',4'-epoxycyclohexane carboxylate, 2-(3,4-epoxycyclohexyl-5,5-spiro-3,4-epoxy)cyclohexane-methdioxane, bis(3,4-epoxycyclohexylmethyl)adipate, vinylcyclohexene oxide, 4-vinylepoxycyclohexane, bis(3,4-epoxy-6-methylcyclohexylmethyl)adipate, 3,4-epoxy-6-methylcyclohexyl-3',4'-epoxy-6'-methylcyclohexane carboxylate, methylenebis(3,4-epoxycyclohexane), dicyclopentadiene diepoxide, di(3,4-epoxycyclohexylmethyl)ether of ethylene glycol, ethylenebis(3,4-epoxycyclohexane carboxylate), dioctyl epoxyhexahydrophthalate, di-2-ethylhexyl epoxyhexahydrophthalate, 1,4-butanediol diglycidyl ether, 1,6-hexanediol diglycidyl ether, glycerol triglycidyl ether, trimethylolpropane triglycidyl ether, polyethylene glycol diglycidyl ether, polypropylene glycol diglycidyl ether, 1,1,3-tetradecadiene dioxide, limonene dioxide, 1,2,7,8-diepoxy octane, and 1,2,5,6-diepoxy cyclooctane; however, the compound having at least two epoxy groups is not limited to those mentioned above.

As a compounds having one oxetanyl group, for example, there may be mentioned 3-ethyl-3-hydroxymethyloxetane, 3-(meth)aryloxymethyl 3-ethyloxetane, (3-ethyl-3-oxetanylmethoxy)methylbenzene, 4-fluoro-[1-(3-ethyl-3-oxetanylmethoxy)methyl]benzene, 4-methoxy-[1-(3-ethyl-3-oxetanylmethoxy)methyl]benzene, [1-(3-ethyl-3-oxetanylmethoxy)ethyl]phenyl ether, isobutoxymethyl (3-ethyl-3-oxetanylmethyl) ether, isobornyloxyethyl (3-ethyl-3-oxetanylmethyl) ether, isobornyl (3-ethyl-3-oxetanylmethyl) ether, 2-ethylhexyl (3-ethyl-3-oxetanylmethyl) ether, ethyldiethylene glycol (3-ethyl-3-oxetanylmethyl) ether, dicyclopentadiene (3-ethyl-3-oxetanylmethyl) ether, dicyclopentenyloxyethyl (3-ethyl-3-oxetanylmethyl) ether, dicyclopentenyl (3-ethyl-3-oxetanylmethyl) ether, tetrahydrofurfuryl (3-ethyl-3-oxetanylmethyl) ether, tetrabromophenyl (3-ethyl-3-oxetanylmethyl) ether, 2-tetrabromophenoxyethyl (3-ethyl-3-oxetanylmethyl) ether, tribromophenyl (3-ethyl-3-oxetanylmethyl) ether, 2-tribromophenoxyethyl (3-ethyl-3-oxetanylmethyl) ether, 2-hydroxyethyl (3-ethyl-3-oxetanylmethyl) ether, 2-hydroxypropyl (3-ethyl-3-oxetanylmethyl) ether, butoxyethyl (3-ethyl-3-oxetanylmethyl) ether, pentachlorophenyl (3-ethyl-3-oxetanylmethyl) ether, pentabromophenyl (3-ethyl-3-oxetanylmethyl) ether, and bornyl (3-ethyl-3-oxetanylmethyl) ether; however, the compound having one oxetanyl group is not limited to those mentioned above.

As a compound having at least two oxetanyl groups, for example, there may be mentioned polyfunctional oxetanes, such as 3,7-bis(3-oxetanyl)-5-oxa-nonane, 3,3'-(1,3-(2-methylenyl)propanediyl bis(oxymethylene))bis(3-ethyloxetane), 1,4-bis[(3-ethyl-3-oxetanylmethoxy)methyl]benzene, 1,2-bis[(3-ethyl-3-oxetanylmethoxy)methyl]ethane, 1,3-bis[(3-ethyl-3-oxetanylmethoxy)methyl]propane, ethylene glycol bis(3-ethyl-3-oxetanylmethyl)ether, dicyclopentenyl bis(3-ethyl-3-oxetanylmethyl) ether, triethylene glycol bis(3-ethyl-3-oxetanylmethyl) ether, tetraethylene glycol bis (3-ethyl-3-oxetanylmethyl) ether, tricyclodecanediyldimethylene (3-ethyl-3-oxetanylmethyl) ether, trimethylolpropane tris(3-ethyl-3-oxetanylmethyl) ether, 1,4-bis(3-ethyl-3-oxetanylmethoxy)butane, 1,6-bis(3-ethyl-3-oxetanylmethoxy) hexane, pentaerythritol tris(3-ethyl-3-oxetanylmethyl) ether, pentaerythritol tetrakis(3-ethyl-3-oxetanylmethyl) ether, polyethylene glycol bis(3-ethyl-3-oxetanylmethyl) ether, dipentaerythritol hexakis(3-ethyl-3-oxetanylmethyl) ether, dipentaerythritol pentakis(3-ethyl-3-oxetanylmethyl) ether, dipentaerythritol tetrakis(3-ethyl-3-oxetanylmethyl) ether, caprolactone modified dipentaerythritol hexakis(3-ethyl-3-oxetanylmethyl) ether, caprolactone modified dipentaerythritol pentakis(3-ethyl-3-oxetanylmethyl) ether, ditrimethylolpropane tetrakis(3-ethyl-3-oxetanylmethyl) ether, EO modified bisphenol A bis(3-ethyl-3-oxetanylmethyl) ether, PO modified bisphenol A bis(3-ethyl-3-oxetanylmethyl) ether, EO modified hydrogenated bisphenol A bis(3-ethyl-3-oxetanylmethyl) ether, PO modified hydrogenated bisphenol A bis(3-ethyl-3-oxetanylmethyl) ether, and EO modified bisphenol F (3-ethyl-3-oxetanylmethyl) ether; however, the compound having at least two oxetanyl groups is not limited to those mentioned above.

The cation polymerizable compounds mentioned above may be used alone, or at least two thereof may be used in combination. In the above compound groups described above, EO represents ethylene oxide, and the EO modified compound represents a compound having a block structure of an ethylene oxide group. In addition, PO represents propylene oxide, and the PO modified compound represents a compound having a block structure of a propylene oxide group. In addition, the "hydrogenated" compound represents a compound in which hydrogen atoms are added to a C=C double bond such as a benzene ring.

Photopolymerization Initiator (Component (B))

In the present invention, the photopolymerization initiator (component (B)) is a compound which senses light having a predetermined wavelength and generates the above polymerization factors (such as radicals or cations). In particular, when the polymerizable compound functioning as the component (A) is a radical polymerizable compound, the photopolymerization initiator (component (B)) is a polymerization initiator which generates radicals by light (radiation, for example, of infrared light, visible light, ultraviolet light, far-ultraviolet light, x-rays, and charged particle rays, such as electron beams). On the other hand, when the polymerizable compound functioning as the component (A) is a cation polymerizable compound, the photopolymerization initiator (component (B)) is a polymerization initiator which generates an acid by light.

As a compound used as a radical generator, for example, there may be mentioned 2,4,5-triarylimidazole dimers which may be substituted, such as a 2-(o-chlorophenyl)-4,5-diphenylimidazole dimer, a 2-(o-chlorophenyl)-4,5-di(methoxypheny)imidazole dimer, a 2-(o-fluorophenyl)-4,5-diphenylimidazole dimer, and a 2-(o- or p-methoxypheny)-4,5-diphenylimidazole dimer; benzophenone derivatives, such as benzophenone, N,N'-tetramethyl-4,4'-diaminobenzophenone (Michler ketone), N,N'-tetraethyl-4,4'-diaminobenzophenone, 4-methoxy-4'-(dimethylamino)benzophenone, 4-chlorobenzophenon, 4,4'-dimethoxybenzophenone, and 4,4'-diaminobenzophenone; aromatic ketone derivatives, such as 2-benzyl-2-dimethylamino-1-(4-morpholino-phenyl)-butanone-1,2-methyl-1-[4-(methylthio)phenyl]-2-morpholino-propanone-1-on; quinones, such as 2-ethylanthraquinone, phenanthrenequinone, 2-t-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthrenequinone, 2-methyl-1,4-naphthoquinone, and 2,3-dimethylanthraquinone; benzoin ether derivatives, such as benzoin methyl ether, benzoin ethyl ether, and benzoin phenyl ether; benzoin derivatives, such as benzoin, methylbenzoin, ethylbenzoin, and propylbenzoin; benzyl derivatives, such as benzyl dimethyl ketal; acridine derivatives, such as 9-phenylacridine and 1,7-bis(9,9'-acridinyl)heptane; N-phenylglycine derivatives, such as N-phenylglycine; acetophenone derivatives, such as acetophenone, 3-methylacetophenone, acetophenone benzylketal, 1-hydroxycyclohexyl phenyl ketone, and 2,2-dimethoxy-2-phenylacetophenone; thioxanthone derivatives, such as thioxanthone, diethylthioxanthone, 2-isopropylthioxanthone, and 2-chlorothioxanthone; xanthone, fluorenone, benzaldehyde, fluorene, anthraquinone, triphenylamine, carbazole, 1-(4-isopropylphenyl)-2-hydroxy-2-methylpropane-1-on, 2-hydroxy-2-methyl-1-phenylpropane-1-on, (2,4,6-trimethylbenzoyl)diphenylphosphine oxide, and bis(2,6-dimethoxybenzoyl)-2,4,4-trimethylpentylphosphine oxide. However, the radical generator is not limited to those mentioned above. In addition, the compounds mentioned above may be used alone, or at least two types thereof may be used in combination.

As a commercially available product of the above photo radical generators, although Irgacure 184, 369, 651, 500, 819, 907, 784, 2959, CGI-1700, -1750, -1850, CG24-61, Darocur 1116 and 1173 (manufactured by Ciba Japan); Lucirin TPO, LR8893, and LR8970 (manufactured by BASF); and Yubekuriru P36 (manufactured by UCB) may be mentioned by way of example, the commercially available product is not limited thereto.

As a compound used as the polymerization initiator which generates an acid by light, although an onium salt compound, a sulfone compound, a sulfonic acid ester compound, a sulfonimide compound, and a diazomethane compound may be mentioned by way of example, the polymerization initiator is not limited thereto. In the present invention, among those compounds mentioned above, an onium salt compound is preferably used.

As the onium salt compound, for example, an iodonium salt, a sulfonium salt, a phosphonium salt, a diazonium salt, an ammonium salt, and a pyridinium salt may be mentioned. As particular examples of the onium salt compound, for example, there may be mentioned bis(4-t-butylphenyl)iodonium perfluoro-n-butanesulfonate, bis(4-t-butylphenyl)iodonium trifluoromethanesulfonate, bis(4-t-butylphenyl)iodonium 2-trifluoromethylbenzenesulfonate, bis(4-t-butylphenyl)iodonium pyrenesulfonate, bis(4-t-butylphenyl)iodonium n-dodecylbenzenesulfonate, bis(4-t-butylphenyl)iodonium p-toluenesulfonate, bis(4-t-butylphenyl)iodonium benzenesulfonate, bis(4-t-butylphenyl)iodonium 10-camphorsulfonate, bis(4-t-butylphenyl)iodonium n-octanesulfonate, diphenyliodonium perfluoro-n-butanesulfonate, diphenyliodonium trifluoromethanesulfonate, diphenyliodonium 2-trifluoromethylbenzenesulfonate, diphenyliodonium pyrenesulfonate, diphenyliodonium n-dodecylbenzenesulfonate, diphenyliodonium p-toluenesulfonate, diphenyliodonium benzenesulfonate, diphenyliodonium 10-camphorsulfonate, diphenyliodonium n-octanesulfonate, triphenylsulfonium perfluoro-n-butanesulfonate, triphenylsulfonium trifluoromethanesulfonate, triphenylsulfonium 2-trifluoromethylbenzenesulfonate, triphenylsulfonium pyrenesulfonate, triphenylsulfonium n-dodecylbenzenesulfonate, triphenylsulfonium p-toluenesulfonate, triphenylsulfonium benzenesulfonate, triphenylsulfonium 10-camphorsulfonate, triphenylsulfonium n-octanesulfonate, diphenyl(4-t-butylphenyl)sulfonium perfluoro-n-butanesulfonate, diphenyl(4-t-butylphenyl)sulfonium trifluoromethanesulfonate, diphenyl(4-t-butylphenyl)sulfonium 2-trifluoromethylbenzenesulfonate, diphenyl(4-t-butylphenyl)sulfonium pyrenesulfonate, diphenyl(4-t-butylphenyl)sulfonium n-dodecylbenzenesulfonate, diphenyl(4-t-butylphenyl)sulfonium p-toluenesulfonate, diphenyl(4-t-butylphenyl)sulfonium benzenesulfonate, diphenyl(4-t-butylphenyl)sulfonium 10-camphorsulfonate, diphenyl(4-t-butylphenyl)sulfonium n-octanesulfonate, tris(4-methoxypheny)sulfonium perfluoro-n-butanesulfonate, tris(4-methoxypheny)sulfonium trifluoromethanesulfonate, tris(4-methoxypheny)sulfonium 2-trifluoromethylbenzenesulfonate, tris(4-methoxypheny)sulfonium pyrenesulfonate, tris(4-methoxypheny)sulfonium n-dodecylbenzenesulfonate, tris(4-methoxypheny)sulfonium p-toluenesulfonate, tris(4-methoxypheny)sulfonium benzenesulfonate, tris(4-methoxypheny)sulfonium 10-camphorsulfonate, and tris(4-methoxypheny)sulfonium n-octanesulfonate. However, the onium salt compound is not limited to those mentioned above.

As the sulfone compound, for example, there may be mentioned a β-ketosulfone, a β-sulfonylsulfone, and an α-diazo compound thereof. As particular examples of the sulfone compound, although phenacyl phenyl sulfone, mesityl phenacyl sulfone, bis(phenylsulfonyl)methane, and 4-trisphenacylsulfone may be mentioned by way of example, the sulfone compound is not limited thereto.

As the sulfonic acid ester compound, for example, alkyl sulfonic acid ester, a halogenated alkyl sulfonic acid ester, an aryl sulfonic acid ester, and an iminosulfonate may be mentioned. As particular examples of the sulfonic acid ester compound, although α-methylolbenzoin perfluoro-n-butanesulfonate, α-methylolbenzoin trifluoromethanesulfonate, and α-methylolbenzoin 2-trifluoromethylbenzenesulfonate may be mentioned by way of example, the sulfonic acid ester compound is not limited thereto.

As particular examples of the sulfonimide compound, although N-(trifluoromethylsulfonyloxy)succinimide, N-(trifluoromethylsulfonyloxy)phthalimide, N-(trifluoromethylsulfonyloxy)diphenylmaleimide, N-(trifluoromethylsulfonyloxy)bicyclo[2.2.1]hept-5-ene-2,3-dicarboximide, N-(trifluoromethylsulfonyloxy)-7-oxabicyclo[2.2.1]hept-5-ene-2,3-dicarboximide, N-(trifluoromethylsulfonyloxy)bicyclo[2.2.1]heptane-5,6-oxy-2,3-dicarboximide, N-(trifluoromethylsulfonyloxy)naphthylimide, N-(10-camphorsulfonyloxy)succinimide, N-(10-camphorsulfonyloxy)phthalimide, N-(10-camphorsulfonyloxy)diphenylmaleimide, N-(10-camphorsulfonyloxy)bicyclo[2.2.1]hept-5-ene-2,3-dicarboximide, N-(10-camphorsulfonyloxy)-7-oxabicyclo[2.2.1]hept-5-ene-2,3-dicarboximide, N-(10-camphorsulfonyloxy)bicyclo[2.2.1]heptane-5,6-oxy-2,3-dicarboximide, N-(10-camphorsulfonyloxy)naphthylimide, N-(4-methylphenylsulfonyloxy)succinimide, N-(4-methylphenylsulfonyloxyl)phthalimide, N-(4-methylphenylsulfonyloxy) diphenylmaleimide, N-(4-methylphenylsulfonyloxyl)bicyclo[2.2.1]hept-5-ene-2,3-dicarboximide, N-(4-methylphenylsulfonyloxy)-7-oxabicyclo[2.2.1]hept-5-ene-2,3-dicarboximide, N-(4-methylphenylsulfonyloxyl)bicyclo[2.2.1]heptane-5,6-oxy-2,3-dicarboximide, N-(4-methylphenylsulfonyloxyl)naphthylimide, N-(2-trifluoromethylphenylsulfonyloxy)succinimide, N-(2-trifluoromethylphenylsulfonyloxyl)phthalimide, N-(2-trifluoromethylphenylsulfonyloxy)diphenylmaleimide, N-(2-trifluoromethylphenylsulfonyloxyl)bicyclo[2.2.1]hept-5-ene-2,3-dicarboximide, N-(2-trifluoromethylphenylsulfonyloxy)-7-oxabicyclo[2.2.1]hept-5-ene-2,3-dicarboximide, N-(2-trifluoromethylphenylsulfonyloxyl)bicyclo[2.2.1]heptane-5,6-oxy-2,3-dicarboximide, N-(2-trifluoromethylphenylsulfonyloxyl)naphthylimide, N-(4-fluorophenylsulfonyloxy)succinimide, N-(4-fluorophenylsulfonyloxyl)phthalimide, N-(4-fluorophenylsulfonyloxy)diphenylmaleimide, N-(4-fluorophenylsulfonyloxyl)bicyclo[2.2.1]hept-5-ene-2,3-dicarboximide, N-(4-fluorophenylsulfonyloxy)-7-oxabicyclo[2.2.1]hept-5-ene-2,3-dicarboximide, N-(4-fluorophenylsulfonyloxyl)bicyclo[2.2.1]heptane-5,6-oxy-2,3-dicarboximide, and N-(4-fluorophenylsulfonyloxyl)naphthylimide may be mentioned by way of example, the sulfonimide compound is not limited thereto.

As particular examples of the diazomethane compound, although bis(trifluoromethylsulfonyl)diazomethane, bis(cyclohexylsulfonyl)diazomethane, bis(phenylsulfonyl)diazomethane, bis(p-toluensulfonyl)diazomethane, methylsulfonyl p-toluenesulfonyl diazomethane, (cyclohexylsulfonyl)(1,1-dimethylethylsulfonyl)diazomethane, and bis(1,1-dimethylethylsulfonyl)diazomethane may be mentioned by way of example, the diazomethane compound is not limited thereto.

Among those photo acid generating agents mentioned above, the onium salt compound is preferable. In the present invention, the photo acid generating agents may be used alone, or at least two thereof may be used in combination.

A blending rate of the polymerization initiator functioning as the component (B) to the total amount of the polymerizable compound functioning as the component (A) is 0.01 to 10 percent by weight and preferably 0.1 to 7 percent by weight. When the blending rate of the polymerization initiator is less than 0.01 percent by weight, a curing rate is decreased, and as a result, the reaction efficiency may be decreased in some cases. On the other hand, when the blending rate of the polymerization initiator is more than 10 percent by weight, mechanical properties of a cured product of the photocurable composition may be degraded in some cases.

Photosensitive Gas Generating Agent (Component (C))

The photosensitive gas generating agent is a substance which performs a chemical reaction (elimination reaction) when receiving light such as ultraviolet rays and which generates a gas in this chemical reaction. As the photosensitive gas generating agent, for example, there may be mentioned an azo-based compound, an azobis-based compound, a diazonium salt-based compound, an azide-based compound, a diazonaphthoquinone-based compound, a sulfohydrazide-based compound, a hydrazo-based compound, a nitrobenzyl carbamate-based compound, a benzoin carbamate-based compound, and a diazomethanesulfonic acid-based compound.

In addition, as the gas to be generated upon reception of light, although carbon dioxide, carbon monoxide, nitrogen, oxygen, and hydrogen may be mentioned by way of example, carbon dioxide or nitrogen is preferable.

As a compound which generates nitrogen upon reception of light, for example, there may be mentioned an azo-based compound, an azobis-based compound, a diazonium salt-based compound, a diazonaphthoquinone-based compound such as a 2-diazo-1,2-naphthoquinone-5-sulfonic acid ester-based compound, and a nitrobenzyl carbamate-based compound.

In addition, as a compound which generates carbon dioxide upon reception of light, for example, there may be mentioned a benzoin carbamate-based compound.

In the present invention, at the interface between the mold and the photocurable composition, the photosensitive gas generating agent is able to break or eliminate the bond or the molecular interaction between the photocurable composition and the mold by a pressure of a gas generated in a light irradiation step which will be described later, so that the mold releasing force can be reduced.

In the photocurable composition of the present invention, the photosensitive gas generating agent functioning as the component (C) has a repeating structure including at least one alkylene oxide chain. By this repeating structure, even if being mixed in the photocurable composition at a high concentration, the photosensitive gas generating agent can be uniformly dispersed in the photocurable composition without causing phase separation and agglomeration.

As the alkylene oxide chain of the photosensitive gas generating agent contained in the photocurable composition of the present invention, in particular, an ethylene oxide chain, a propylene oxide chain, and a butylene oxide chain may be mentioned by way of example.

In the present invention, as the photosensitive gas generating agent functioning as the component (C), compounds represented by the following general formulas (1) to (3) may be mentioned.

  (1),

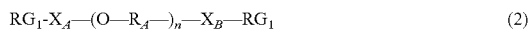  (2)

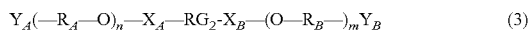  (3)

In the formula (1), $RG_1$ represents a monovalent substituent which functions as the photostimulation responsive portion. As the substituent represented by $RG_1$, in particular, a substituent selected from the following substituent groups may be mentioned by way of example.

[Chem. 1]

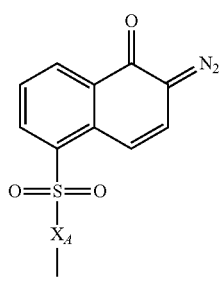 (P)

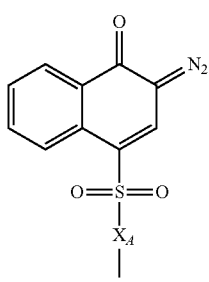 (Q)

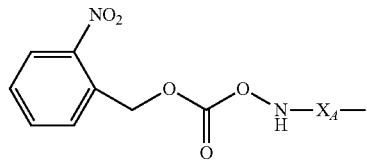 (R)

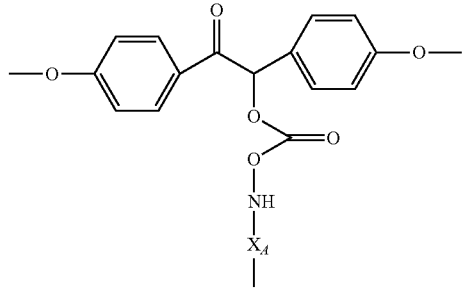 (S)

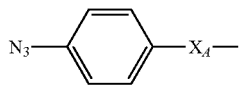 (T)

In the above formulas, $X_A$ represents a divalent linking group which will be described later.

In the substituent groups shown above, (P) and (Q) each represent a diazonaphthoquinone-based compound and each generate nitrogen by photostimulation. In the above substituent groups, (R) represents a nitrobenzyl carbamate-based compound and generates carbon dioxide by photostimulation. In the above substituent groups, (S) represents a benzoin carbamate-based compound and generates carbon dioxide by photostimulation. In the above substituent groups, (T) represents an azide-based compound and generates nitrogen by photostimulation.

In the present invention, as a monovalent substituent which functions as the photostimulation responsive portion, a 2-diazo-1,2-naphthoquinone group is preferable.

In the formula (1), $X_A$ represents a divalent linking group. As a particular example of the linking group represented by $X_A$, for example, there may be mentioned an oxygen atom, a sulfur atom, an alkylene group, a phenylene group, a naphthylene group, an ester group, an ether group, a thioether group, a sulfonyl group, a secondary amino group, a tertiary amino group, an amide group, a urethane group, or a divalent composite substitute which is formed from at least two of those divalent linking groups connected to each other by at least one covalent bond.

In the formula (1), $R_A$ represents an alkylene group. As the alkylene group represented by $R_A$, in particular, for example, an ethylene group, a n-propylene group, an i-propylene group, and a butylene group may be mentioned.

In the formula (1), $Y_A$ represents a monovalent functional group. As particular examples of the monovalent functional group represented by $Y_A$, for example, a hydrogen atom, a halogen atom, an alkoxy group, a hydroxyl group, a carboxyl group, a thiol group, a pyridyl group, a silanol group, and a sulfo group may be mentioned.

In the formula (1), n is an integer of 1 or more. In addition, n is preferably an integer of 1 to 25.

In the formula (2), $RG_1$ and $RG_1'$ each represent a monovalent substituent which functions as the photostimulation responsive portion. Particular examples of the substituents represented by $RG_1$ and $RG_1'$ are similar to the particular examples of $RG_1$ in the formula (1). In addition, $RG_1$ and $RG_1'$ may be identical to or different from each other.

In the formula (2), $X_A$ and $X_B$ each represent a divalent linking group. As a particular example of the linking groups represented by $X_A$ and $X_B$, for example, there may be mentioned an oxygen atom, a sulfur atom, an alkylene group, a phenylene group, a naphthylene group, an ester group, an ether group, a thioether group, a sulfonyl group, a secondary amino group, a tertiary amino group, an amide group, a urethane group, or a divalent composite substitute which is formed from at least two of those divalent linking groups connected to each other by at least one covalent bond. In addition, $X_A$ and $X_B$ may be identical to or different from each other.

In the formula (2), $R_A$ represents an alkylene group. As particular examples of the alkylene group represented by $R_A$, for example, an ethylene group, a n-propylene group, an i-propylene group, and a butylene group may be mentioned.

In the formula (2), n is an integer of 1 or more. In addition, n is preferably an integer of 1 to 25.

In the formula (3), $RG_2$ represents a divalent substituent which functions as the photostimulation responsive portion. As the substituent represented by $RG_2$, in particular, a substituent selected from the following substituent groups may be mentioned.

[Chem. 2]

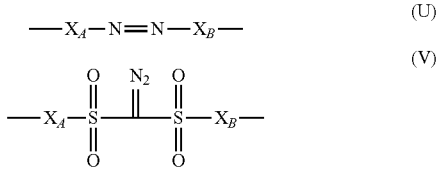

In the formula, $X_A$ and $X_B$ each represent a divalent linking group which will be described later. $X_A$ and $X_B$ may be identical to or different from each other.

In the above substituent groups, (U) represents an azobis-based compound and generates nitrogen by photostimulation. In the above substituent groups, (V) represents a diazomethane sulfonic acid-based compound and generates nitrogen by photostimulation.

In the formula (3), $R_A$ and $R_B$ each represent an alkylene group. As particular examples of the alkylene groups represented by $R_A$ and $R_B$, for example, an ethylene group, a n-propylene group, an i-propylene group, and a butylene group may be mentioned. In addition, $R_A$ and $R_B$ may be identical to or different from each other.

In the formula (3), $X_A$ and $X_B$ each represent a divalent linking group. As a particular example of the linking groups represented by $X_A$ and $X_B$, for example, there may be mentioned an oxygen atom, a sulfur atom, an alkylene group, a phenylene group, a naphthylene group, an ester group, an ether group, a thioether group, a sulfonyl group, a secondary amino group, a tertiary amino group, an amide group, a urethane group, or a divalent composite substitute which is formed from at least two of those divalent linking groups connected to each other by at least one covalent bond. In addition, $X_A$ and $X_B$ may be identical to or different from each other.

In the formula (3), $Y_A$ and $Y_B$ each represent a monovalent substituent. As particular examples of the monovalent substituents represented by $Y_A$ and $Y_B$, for example, a hydrogen atom, a halogen atom, an alkoxy group, a hydroxyl group, a carboxyl group, a thiol group, a pyridyl group, a silanol group, and a sulfo group may be mentioned. In addition, $Y_A$ and $Y_B$ may be identical to or different from each other.

In the formula (3), n is an integer of 1 or more. In addition, n is preferably an integer of 1 to 25. m is an integer of 1 or more. In addition, m is preferably an integer of 1 to 25. Furthermore, n and m may be identical to or different from each other.

Through intensive research carried out by the present inventors, it was found that since the photosensitive gas generating agent functioning as the component (C) has high solubility with the above polymerizable compound (A), compared to known photosensitive gas generating agents, the component (C) can be uniformly contained in the polymerizable compound at a high concentration. Since the photocurable composition of the present invention is able to uniformly contain the photosensitive gas generating agent functioning as the component (C) at a high concentration, the amount of gas to be generated per unit area by light irradiation can be increased. Accordingly, by the use of the photocurable composition of the present invention, the mold releasing force can be reduced. In addition, since the amount of gas to be generated per unit time can be increased, a light irradiation step can be completed within a shorter time, and hence the productivity can be improved.

In general, since a mold releasing-force reduction effect obtained by gas generation depends on the amount of gas to be generated per unit area, as the film thickness is increased, the effect is increased. However, since the photocurable composition of the present invention can increase the concentration of the photosensitive gas generating agent functioning as the component (C), even if the film thickness of a film formed from the photocurable composition is small (such as 10 μm or less), the mold releasing-force reduction effect can be obtained.

As particular examples of the compound used as the photosensitive gas generating agent functioning as the component (C), for example, a compound disclosed in Non-Patent Literature 2 may be mentioned. As the compound mentioned above, in particular, hexa(ethylene oxide)monomethyl ether 12-(2-diazo-1,2-naphthoquinone-5-sulfonylamino)dodecanoate shown below has been disclosed. However, the present invention is not limited thereto.

[Chem. 3]

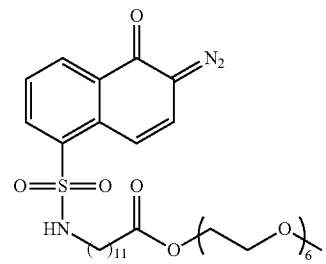

A blending rate of the photosensitive gas generating agent functioning as the component (C) to the total amount of the polymerizable compound functioning as the component (A) is, for example, 0.1 to 50 percent by weight, preferably 0.5 to 20 percent by weight, and more preferably 10 to 20 percent by weight. When the blending rate of the photosensitive gas generating agent to the total amount of the polymerizable compound is less than 0.1 percent by weight, the effect of the present invention may not be sufficiently obtained in some cases. On the other hand, when the blending rate of the photosensitive gas generating agent to the total amount of the photocurable composition is more than 50 percent by weight, a mechanical strength of a photo-cured film may not be sufficiently secured, and as a result, a pattern defect may arise in some cases. In consideration of the reduction in mold releasing force, the blending rate of the photosensitive gas generating agent to the total amount of the photocurable composition functioning as the component (A) is preferably 10 percent by weight or more.

Fluorinated Surfactant (Component (D))

Besides the components (A) to (C) described above, the photocurable composition of the present invention preferably further includes a fluorinated surfactant (component (D)).

As the fluorinated surfactant (D), a fluorinated surfactant having no polymerizing property may be used. By the addition of the fluorinated surfactant functioning as the component (D), since the bonding force (interfacial bonding force) generated at the interface between the mold and the resist can be reduced, the mold releasing-force reduction effect by the photosensitive gas generating agent functioning as the component (C) can be further enhanced.

As the fluorinated surfactant functioning as the component (D), a compound represented by the following general formula (4) is preferable.

$$Rf_1\text{-Rc-X} \quad (4)$$

In the formula (4), $Rf_1$ represents a water-repellent and lipid-repellent functional group at least including a fluorine atom and a carbon atom. In addition, besides a fluorine atom and a carbon atom, for example, $Rf_1$ may further have an oxygen atom. As particular examples of the water-repellent and lipid-repellent functional group represented by $Rf_1$, for example, a perfluoroalkyl group and a perfluoropolyether group may be mentioned.

In the formula (4), Rc represents a lipophilic functional group. As particular examples of the lipophilic functional group represented by Rc, for example, a poly(alkylene oxide), such as a poly(ethylene oxide) or a poly(propylene oxide), and an alkylene group may be mentioned.

In the formula (4), X represents a polar functional group. As particular examples of the polar functional group represented by X, for example, a hydroxyl group, a carboxyl group, a sulfo group, an amino group, or an alkoxy group may be mentioned.

In the photocurable composition of the present invention, the fluorinated surfactants functioning as the component (D) may be used alone, or at least two types thereof may be used in combination.

In the photocurable composition of the present invention, a blending rate of the fluorinated surfactant functioning as the component (D) to the total amount of the polymerizable compound functioning as the component (A) is, for example, 0.001 to 10 percent by weight. The blending rate described above is preferably 0.002 to 5 percent by weight and more preferably 0.005 to 3 percent by weight. When the blending rate is less than 0.001 percent by weight, the effect of the present invention may not be sufficiently obtained. When the blending rate is more than 10 percent by weight, since the surface tension may be decreased, and/or the contact angle to the mold or the substrate may be increased in some cases, the filling property of the photocurable composition itself is degraded.

Other Additive Components

In addition, besides the components (A) to (C) (or components (A) to (D)), the photocurable composition of the present invention may further contain additive components. That is, besides the polymerizable compound (component (A)), the polymerization initiator (component (B)), and the photosensitive gas generating agent (component (C)), in accordance with various purposes, the photocurable composition of the present invention may further contain additive components, such as a sensitizer, an antioxidant, a solvent, and a polymer component, so as not to degrade the effect of the present invention.

The sensitizer is a compound which is appropriately added to promote a polymerization reaction and/or to improve a reaction conversion rate. As the sensitizer, for example, a hydrogen donor or a sensitizing dye may be mentioned.

The hydrogen donor is a compound which reacts with initiation radicals generated from the polymerization initiator functioning as the component (B) and radicals located at polymerization growth terminals so as to generate radicals having a higher activity. The hydrogen donor is preferably added when a photoradical generating agent is used as the polymerization initiator.

As particular examples of the hydrogen donor, although amine compounds, such as N-butylamine, di-n-butylamine, tri-n-butylphosphine, allylthiourea, s-benzyl isothiuronium-p-toluenesulfinate, triethylamine, diethylaminoethyl methacrylate, triethylenetetramine, 4,4'-bis(dialkylamino)benzophenone, N,N-dimethylaminobenzoic acid ethyl ester, N,N-dimethylaminobenzoic acid isoamyl ester, pentyl-4-(dimethylamino)benzoate, triethanolamine, and N-phenylglycine; and mercapto compounds, such as 2-mercapto-N-phenylbenzoimidazole and mercaptopropionic acid ester, may be mentioned by way of example, the hydrogen donor is not limited thereto.

The sensitizing dye is a compound which is excited by absorbing light having a predetermined wavelength and which interacts with the polymerization initiator functioning as the component (B). In addition, the interaction described above indicates, for example, energy transfer or electron transfer from the sensitizing dye in an excited state to the polymerization initiator functioning as the component (B).

As particular examples of the sensitizing dye, although an anthracene derivative, an anthraquinone derivative, a pyrene derivative, a perylene derivative, a carbazole derivative, a benzophenone derivative, a thioxanthone derivative, a xanthone derivative, a coumarin derivative, a phenothiazine derivative, a camphorquinone derivative, an acridine dye, thiopyrylium salt dye, a merocyanine dye, a quinoline dye, a styrylquinoline dye, a ketocoumarin dye, a thioxanthene dye, a xanthene dye, an oxonol dye, a cyanine dye, a rhodamine dye, and a pyrylium salt dye may be mentioned by way of example, the sensitizing dye is not limited thereto.

The sensitizers may be used alone, or at least two types thereof may be used in combination.

In the photocurable composition of the present invention, with respect to the total amount of the polymerizable compound functioning as the component (A), the amount of the sensitizer is preferably 0 to 20 percent by weight, more preferably 0.1 to 5.0 percent by weight, and even more preferably 0.2 to 2.0 percent by weight. When the content of the sensitizer is at least 0.1 percent by weight, the effect of the sensitizer can be more effectively obtained. In addition, when the content of the sensitizer is set to 5.0 percent by weight or less, the molecular weight of a high molecular weight compound forming a photo-cured product to be formed is sufficiently increased, and at the same time, dissolution failure and degradation in storage stability can be suppressed.

Temperature at Blending of Photocurable Composition

When the photocurable composition is prepared by mixing and dissolving reagents and solvents, the preparation is performed under a predetermined temperature condition. In particular, preparation is performed in a range of 0° C. to 100° C.

Viscosity of Photocurable Composition

As for the viscosity of the photocurable composition of the present invention, a viscosity at 23° C. of a mixture of the components other than the solvent is preferably 1 to 100 cP, more preferably 5 to 50 cP, and even more preferably 6 to 20 cP. If the viscosity of the photocurable composition is more than 100 cP, when the photocurable composition is brought into contact with the mold, a time required to fill the composition into recess portions of a fine pattern of the mold will become longer, and pattern defects due to filling failure may arise in some cases. On the other hand, when the viscosity is less than 1 cP, coating irregularities may arise when the photocurable composition is applied, and when the photocurable composition is brought into contact with the mold, the photocurable composition may flow out of end portions of the mold in some cases.

Surface Tension of Photocurable Composition

As for the surface tension of the photocurable composition of the present invention, a surface tension at 23° C. of the mixture of the components other than the solvent is preferably 5 to 70 mN/m, more preferably 7 to 35 mN/m, and even more preferably 10 to 32 mN/m. If the surface tension is less than 5 mN/m, when the photocurable composition is brought into contact with the mold, the time required to fill the composition into the recess portions of the fine pattern of the mold will become longer. On the other hand, when the surface tension is more than 70 mN/m, the surface smoothness is degraded.

Impurities, such as Particles, Mixed in Photocurable Composition

In the photocurable composition of the present invention, impurities are preferably removed as much as possible. For example, in order to prevent the generation of pattern defects due to unwanted irregularities of a photo-cured product caused by particles which are unfavorably mixed in the photocurable composition, the impurities, such as particles, are preferably removed. In particular, after the individual components of the photocurable composition are mixed together, the mixture thus obtained is preferably allowed to pass through a filter having a pore size in a range of 0.001 to 5.0 μm. When the filtration is performed using a filter, the filtration is more preferably performed through multiple stages or is more preferably repeated many times. In addition, a filtrate may be again filtrated. As the filter to be used for the filtration, although a filter, such as a polyethylene resin filter, a polypropylene resin filter, a fluorinated resin filter, or a nylon resin filter, may be used, the filter is not particularly limited.

In addition, when the photocurable composition of the present invention is used for manufacturing a semiconductor integrated circuit, in order not to disturb the performance thereof, metal impurities are preferably prevented as much as possible from being mixed in the composition. Hence, in the photocurable composition of the present invention, the concentration of metal impurities contained in the composition is preferably set to 10 ppm or less and more preferably set to 100 ppb or less.

Method for Manufacturing Film

Next, a method for manufacturing a film according to the present invention will be described. FIG. 1 includes schematic cross-sectional views showing one example a method for manufacturing a film according to an embodiment of the present invention. A manufacturing process shown in FIG. 1 includes the following steps [1] to [5] or [6].

[1] an arrangement step (coating step, FIG. 1(a))
[2] a mold contact step (FIGS. 1(b1) and 1(b2))
[3] a light irradiation step (FIG. 1(c))
[4] a mold releasing step (FIG. 1(d))
[5] a residual film removal step (FIG. 1(e))
[6] a substrate processing step (FIG. 1(f))

In the above manufacturing process, the residual film removal step (FIG. 1(e)) is a step of removing a film (residual film) remaining in a recess portion of the photocurable composition after the mold releasing step (FIG. 1(d)) by etching to expose the surface of a substrate 2, which is a processing substrate to be processed, at the recess portion. When an optical element or an electronic component is formed using the above manufacturing process, the residual film removal step (FIG. 1(e)) is preferably performed.

In the present invention, a surface of the mold in contact with the photocurable composition in the contact step is preferably formed from quartz. Quartz has a preferable affinity for a polar functional group, such as an ethylene oxide, a propylene oxide, or a hydroxyl group. Hence, in particular, when the fluorinated surfactant functioning as the component (D) is contained in the photocurable composition of the present invention, a lamellar structure is likely to be formed at the interface between the mold and the photocurable composition.

In addition, in the present invention, the light irradiation step is a step of irradiating the photocurable composition with light through the mold, and the mold used in this step has a surface in which a concavo-convex pattern is formed. By the use of this mold, a film having a pattern shape corresponding to the concavo-convex pattern of the mold surface can be formed.

Through the steps [1] to [6] (or the steps [1] to [5]), a photo-cured product 12 can be obtained from a photocurable composition 1, and in addition, an electronic component (electronic device) or an optical component having the photo-cured product 12 can be also obtained. Hereinafter, the individual steps will be described in detail.

Arrangement Step (FIG. 1(a))

First, the photocurable composition 1 is arranged (applied) on the substrate 2 to form a coating film (FIG. 1(a)). The photocurable composition described above is the photocurable composition of the present invention.

As a processing substrate corresponding to the substrate 2, although a silicon wafer is used in general, the substrate is not limited thereto. Besides a silicon wafer, among known materials used for semiconductor device substrates, such as aluminum, a titanium-tungsten alloy, an aluminum-silicon alloy, an aluminum-copper-silicon alloy, silicon oxide, and silicon nitride, an appropriate material may be arbitrarily selected. In addition, as a substrate to be used (processing substrate), a substrate having an adhesion property to the photocurable composition improved by a surface treatment, such as a silane coupling treatment, a silazane treatment, or formation of an organic thin film, may also be used as the processing substrate.

As a method for arranging the photocurable composition of the present invention on the processing substrate, for example, there may be used an ink jet method, a dip coating method, an air knife coating method, a curtain coating method, a wire bar code method, a gravure coating method, an extrusion coating method, a spin coating method, or a slit scan method. In addition, although the film thickness of a shape-transferred layer (coating film) varies depending on its application, the thickness is for example, in a range of 0.01 to 100.0 μm.

Mold Contact Step (FIGS. 1(b1) and 1(b2))

Next, a step (mold contact step, FIGS. 1(b1) and 1(b2)) of bringing the mold into contact with the coating film of the photocurable composition 1 formed in the previous step (arrangement step) is performed. In addition, since a mold 3 may be regarded as a seal, this step may also be called a sealing step. In this step, when the mold 3 is brought into contact with the photocurable composition 1 (shape-transferred layer) (FIG. 1(b1)), (part of) a coating film 11 is filled into the recess portions of the fine pattern formed in the mold 3 (FIG. 1(b2)).

The mold 3 used in the mold contact step is required to be formed from an optical transparent material in consideration of the following step (light irradiation step). As a material forming the mold 3, in particular, for example, glass, quartz, an optical transparent resin, such as a PMMA or a polycarbonate resin, a transparent metal deposition film, a flexible film such as a poly(dimethyl siloxane), an optical curable film, or a metal film may be mentioned.

As the mold 3 used in the method for manufacturing a photo-cured product according to the present invention, a mold processed by a surface treatment may also be used, the surface treatment being performed to improve the releasing property between the photocurable composition 1 and the surface of the mold 3. As the surface treatment method, for example, there may be mentioned a method in which before the mold contact step is performed, a mold release-agent layer is formed by applying a mold release agent on the surface of the mold. As the mold release agent applied to the surface of the mold, for example, a silicone-based mold release agent, a fluorine-based mold release agent, a polyethylene-based mold release agent, a polypropylene-based mold release agent, a paraffin-based mold release agent, a montan wax-based mold release agent, and a carnauba wax-based mold release agent may be mentioned. For example, commercially available coating type mold release agents, such as OPTOOL DSX manufactured by Daikin Industries Ltd., may also be preferably used. In addition, the mold release agents may be used alone, or at least two types thereof may be used in combination. Among those mentioned above, in particular, a fluorinated mold release agent is preferable.

In the mold contact step, as shown in FIG. 1(b1), when the mold 3 is brought into contact with the photocurable composition 1, although the pressure to be applied to the photocurable composition 1 is not particularly limited, the pressure is generally in a range of 0.1 to 100 MPa. In the range described above, the pressure is preferably 0.1 to 50 MPa, more preferably 0.1 to 30 MPa, and even more preferably 0.1 to 20 MPa. In addition, although a time required for the mold 3 to be in contact with the shape-transfer layer 1 in the contact step is not particularly limited, the time is generally 1 to 600 seconds, preferably 1 to 300 seconds, more preferably 1 to 180 seconds, and even more preferably 1 to 120 seconds.

In addition, the mold contact step may be performed in any of an air atmosphere, a reduced-pressure atmosphere, and an inert gas atmosphere. Since influences of oxygen and moisture on a photo curing reaction can be prevented, a reduced-pressure atmosphere or an inert gas atmosphere is preferable. When the contact step is performed in an inert gas atmosphere, as particular examples of a gas to be used, for example, nitrogen, carbon dioxide, helium, argon, various types of fluorinated gases, or a mixed gas therebetween may be mentioned. When this step (contact step) is performed in a specific gas atmosphere including an air atmosphere, a preferable pressure is 0.0001 to 10 atoms. In addition, since the influences of oxygen and moisture on a photo curing reaction can be prevented, a reduced-pressure atmosphere or an inert gas atmosphere is preferable.

Light Irradiation Step (FIG. 1(c))

Next, the coating film 11 is irradiated with light through the mold 3 (FIG. 1(c)). In this step, the coating film 11 is cured by irradiation light to form the photo-cured product 12. In this step, in the photocurable composition of the present invention, first, the polymerizable compound functioning as the component (A) is cured, and subsequently, a gas is generated from the photosensitive gas generating agent functioning as the component (C). In order to sequentially perform these reactions as described above, it is preferable to appropriately control the reaction conditions so that a polymerization reaction rate of the polymerizable compound functioning as the component (A) contained in the photocurable composition 1 is faster than a gas generating reaction rate of the photosensitive gas generating agent functioning as the component (C). When the polymerization reaction rate is faster than the gas generating reaction rate, after the polymerizable compound is cured, the gas is concentrated primarily at the interface between the mold and the photocurable composition, and as a result, the mold releasing-force reduction effect can be obtained. However, when the gas generating reaction rate is faster than the polymerization reaction rate, for example, foam formation may adversely occur in the photo-cured product 12, and/or the mold releasing-force reduction effect may not be unfavorably obtained in some cases.

Although light irradiating the photocurable composition 1 which forms the coating film 11 is selected in accordance with a sensitive wavelength of the photocurable composition 1, in particular, for example, ultraviolet rays having a wavelength of 150 to 400 nm, x-rays, or electron beams are preferably appropriately selected for the use. In addition, as a commercially available curing accessory agent (photopolymerization initiator), there are many compounds having sensitivity to ultraviolet rays. Accordingly, in particular, the light (irradiation light 4) irradiating the photocurable composition 1 is preferably ultraviolet rays. As a light source for generating ultraviolet rays, for example, although a high pressure mercury lamp, an ultra-high pressure mercury lamp, a low pressure mercury lamp, a deep-UV lamp, a carbon-arc lamp, a chemical lamp, a metal halide lamp, a xenon lamp, a KrF excimer laser, an ArF excimer laser, and an $F_2$ excimer laser may be mentioned, an ultra-high pressure mercury lamp is particularly preferable. In addition, the number of light sources to be used may be either one or at least two. In addition, when light irradiation is performed, the surface of the photocurable composition 1 may be either entirely or partially irradiated.

In addition, when the shape-transferred layer is also cured by heat, heat curing may also be performed. When heat curing is performed, a heating atmosphere, a heating temperature, and the like are not particularly limited. For example, in an inert gas atmosphere or a reduced-pressure atmosphere, the photocurable composition 1 may be heated to a range of 40° C. to 200° C. In addition, when the shape-transferred layer 1 is heated, for example, a hot plate, an oven, or a furnace may be used.

Mold Releasing Step (FIG. 1(d))

Next, a step (mold releasing step, FIG. 1(d)) of releasing the mold 3 from the photo-cured product 12 is performed to form a cured film having a predetermined pattern shape on the substrate 2. This step (mold releasing step) is a step of peeling the mold 3 from the photo-cured product 12, and a reversed pattern of the fine pattern of the mold 3 formed in the previous step (light irradiation step) is obtained as a pattern of the photo-cured product 12.

A method for peeling the mold 3 from the photo-cured product 12 is not particularly limited as long as part of the photo-cured product 12 is not physically fractured in the peeling, and various conditions and the like are also not particularly limited. In order to peel the mold 3, for example, the mold 3 may be moved so as to be apart from the processing substrate while the processing substrate (substrate 2) is fixed, the processing substrate may be moved so as to be apart from the mold 3 while the mold 3 is fixed, or the mold 3 and the processing substrate may be both pulled in opposite directions.

Residual Film Removal Step (FIG. 1(e))

Although the cured film obtained in the above mold releasing step has a predetermined pattern shape, the film may partially remain as a residual film in some cases in a region other than that in which this pattern shape is formed. Hence, for the above pattern shape, a step (residual film removal step, FIG. 1(e)) of removing a residual photo-cured film (residual film) is performed in a region in which the photo-cured product is to be removed.

As a method for removing a residual film, for example, a method may be mentioned in which the film (residual film) remaining in the recess portion of the photo-cured product 12 is removed by etching to expose the surface of the substrate 2 in the pattern recess portion.

When etching is used, concrete methods thereof are not particularly limited, and known methods, such as dry etching, may be performed. Dry etching may be performed using a known dry etching apparatus. In addition, a source gas for dry etching may be appropriately selected in accordance with an element composition of a film to be etched, and for example, a gas containing an oxygen atom, such as $O_2$, CO, or $CO_2$; an inert gas, such as He, $N_2$, or Ar; a chlorine gas, such as $Cl_2$ or $BCl_3$; and a gas, such as $H_2$ or $NH_3$, may be used. In addition, those gases mentioned above may be used in combination.

In the manufacturing process including the above steps [1] to [5], the photo-cured product 12 having a desired concavo-convex pattern shape (pattern shape derived from the concavo-convex pattern shape of the mold 3) can be obtained. In addition, when the substrate 2 is processed using this photo-cured product 12, a step of processing a substrate, which will be described below, may be further performed in some cases.

On the other hand, the photo-cured product 12 thus obtained may also be used as an optical member (including the case in which the photo-cured product 12 is used as a part of an optical member). In the case described above, an optical member at least including the substrate 2 and the photo-cured product 12 disposed thereon may be provided.

Substrate Processing Step (FIG. 1(f))

The photo-cured product 12 having a desired concavo-convex pattern shape obtained by the manufacturing method of the present invention may be used, for example, as an interlayer insulating film contained an electronic component represented by a semiconductor element, such as an LSI, a system LSI, a DRAM, a SDRAM, a RDRAM, or a D-RDRAM. In addition, this photo-cured product 12 may also be used as a resist film in semiconductor-element manufacturing.

When the photo-cured product 12 is used as a resist film, in particular, as shown in FIG. 1(f), etching or ion implantation is performed on a part (region represented by reference numeral 20) of the substrate at which the surface thereof is exposed in the etching step. In this case, the photo-cured product 12 functions as a mask. Hence, a circuit structure (not shown) based on the pattern shape of the photo-cured product 12 is formed in the substrate 2. Accordingly, a circuited substrate used for a semiconductor element or the like can be manufactured. In addition, when an electronic member is provided on this circuited substrate, an electronic component can be formed.

In addition, when a circuited substrate or an electronic component is formed, although the pattern of the photo-cured product may be finally removed from a processed substrate, the structure in which the photo-cured product is allowed to remain as a member of forming an element is also preferable.

EXAMPLES

Hereinafter, although the present invention will be described in detail with reference to examples, the technical scope of the present invention is not limited to the following examples.

Synthetic Example 1

Synthesis of Hexa(Ethylene Oxide)Monomethyl Ether 12-(2-Diazo-1,2-Naphthoquinone-5-Sulfonylamino)Dodecanoate (NIT-29)

Hexa(ethylene oxide)monomethyl ether 12-(2-diazo-1,2-naphthoquinone-5-sulfonylamino)dodecanoate (NIT-29) represented by the following formula was synthesized using a synthetic method disclosed in Non-Patent Literature 2. The yield was 86%.

[Chem. 4]

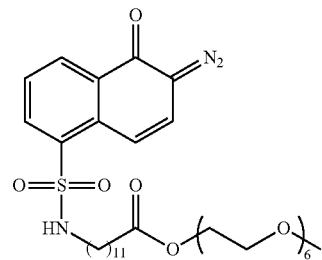

Example 1

(1) Photocurable Composition

First, the following components (A), (B), (C), and (D) were blended together to obtain a mixed solution.

(1-1) Component (A): 94 Parts by Weight in Total

<A-1> isobornyl acrylate (trade name: IB-XA, manufactured by kyoeisha Chemical Co., Ltd.): 61.6 parts by weight <A-2> (2-methyl-2-ethyl-1,3-dioxolane-4-yl)methyl acrylate (trade name: MEDOL-10, manufactured by Osaka Organic Chemical Industry Ltd.): 10 parts by weight <A-3> hexanediol diacrylate (trade name: Biscoat #230, manufactured by Osaka Organic Chemical Industry Ltd.): 22.4 parts by weight (1-2) Component (B): 1 Part by Weight Irgacure 369 (manufactured by Ciba Japan)

(1-3) Component (C): 10 Parts by Weight

NIT-29: 10 parts by weight (1-4) Component (D): 1.1 Parts by Weight

Pentadeca(ethylene glycol) mono-1H,1H,2H,2H-perfluorooctyl ether (F $(CF_2)_6CH_2CH_2$ $(OCH_2CH_2)_{15}OH$, manufactured by DIC): 1.1 parts by weight Next, the mixed solution thus obtained was filtrated with an ultrahigh molecular weight polyethylene filter having a filter sieve size of 5 nm. Accordingly, a photocurable composition (a-1) of this example (Example 1) was prepared.

Subsequently, by the following method, a photo-cured product was formed.

The photocurable composition (a-1) in an amount of 16 µl was dripped using a micropipette on a 34-inch silicon wafer on which an adhesion promoting layer having a thickness of 60 nm was formed as an adhesive layer.

(2) Mold Contact Step and Light Irradiation Step

Next, a quartz mold (length: 40 mm, width: 40 mm) which was not surface-treated and in which a pattern was not formed was brought into contact with the silicon wafer described above. The film thickness of the photocurable composition (a-1) formed in this step was approximately 10 µm.

Subsequently, after 30 seconds from the contact of the quartz mold with the photocurable composition, the photocurable composition was irradiated with UV light through the quartz mold using a UV light source. In addition, in this example, as the UV light source, a UV light source, EXECURE 3000 (manufactured by HOYA CANDEO OPTRONICS CORPORATION), having a 200-W mercury-xenon lamp and a bandpass filter selectively transmitting light having a wavelength of 313 nm was used. The luminance under the quartz mold was 20 mW/cm² at a wavelength of 313 nm.

When the light irradiation step was performed under the conditions described above, an interference pattern derived from a gap generated between the resist and the mold in the irradiation was observed by naked eyes through the quartz mask and extended over the mask within 60 seconds from the start of the light irradiation. At this point, the light irradiation was stopped.

(3) Mold Releasing Step

Next, the quartz mold was lifted up at a rate of 0.5 mm/s so as to be released from the photo-cured product.

By the steps described above, the photo-cured product was obtained.

(4) Evaluation of Photo-Cured Product

Next, measurement described below was performed on the photo-cured product thus obtained, and the properties thereof were evaluated.

(4-1) Mold Releasing Force Measurement

A force required to release the mold from the photo-cured product in the mold releasing step was measured using a load cell (compact tension/compression load cell LUR-A-200NSA1 (manufactured by Kyowa Electronic Instruments Co., Ltd.). According to the measurement results, the mold releasing force was at most 20 N or less (noise level) and was smaller than that of a photo-cured product formed from a photocurable composition (b-2) in Comparative Example 2 which will be described later. In addition, in this example, the interference pattern generated at a front surface of the mask in the light irradiation step was observed faster than that in Comparative Example 2. Hence, since a time required for the light irradiation step can be decreased, the method for manufacturing a film of the present invention is proved to have a high productivity.

Example 2

A photocurable composition (a-2) was prepared by a method similar to that of Example 1 except that in Example 1, 9.28 parts by weight of NIT-40 represented by the following formula was used as the component (C).

[Chem. 5]

$$\text{(structure shown)}$$

In addition, the photocurable composition was irradiated with UV rays by a method similar to that of Example 1 except that in Example 1, the photocurable composition (a-2) was used instead of using the photocurable composition (a-1). An interference pattern derived from a gap generated between the resist and the mold in the irradiation was observed by naked eyes through the quartz mask and extended over the mask within 240 seconds from the start of the light irradiation.

In addition, after 240 seconds from the start of the light irradiation, when the mold releasing force was measured in a manner similar to that of Example 1, the mold releasing force was at most 20 N or less (noise level) and was lower than that obtained in Comparative Examples 3 and 4 which will be described later.

Example 3

A photocurable composition (a-3) was prepared by a method similar to that of Example 1 except that in Example 1, 6.44 parts by weight of NIT-42 represented by the following formula was used as the component (C).

[Chem. 6]

$$\text{(structure shown)}$$

In addition, the photocurable composition was irradiated with UV rays by a method similar to that of Example 1 except that in Example 1, the photocurable composition (a-3) was used instead of using the photocurable composition (a-1). An interference pattern derived from a gap generated between the resist and the mold in the irradiation was observed by naked eyes through the quartz mask and extended over the mask within 240 seconds from the start of the light irradiation.

In addition, after 240 seconds from the start of the light irradiation, when the mold releasing force was measured in a manner similar to that of Example 1, the mold releasing force was at most 20 N or less (noise level) and was lower than that obtained in Comparative Examples 3 and 4 which will be described later.

Comparative Example 1

A photocurable composition (b-1) was prepared by a method similar to that of Example 1 except that in Example 1, 2 parts by weight of 2-diazo-1,2-naphthoquinone-5-sulfonic acid p-cresol ester (PC-5, manufactured by Toyo Gosei Co. Ltd.) was used as the component (C).

In addition, a photo-cured product was obtained by a method similar to that of Example 1 except that in Example 1, the photocurable composition (b-1) was used instead of using the photocurable composition (a-1). However, in this comparative example, although the photocurable composition (film formed therefrom) was irradiated with light for 600 seconds in the light irradiation step, an interference pattern similar to that of Example 1 was not observed.

In this comparative example, when the mold releasing force was measured by a method similar to that of Example 1, the mold releasing force was 165 N.

Comparative Example 2

A photocurable composition (b-2) was prepared by a method similar to that of Example 1 except that in Example 1, 15 parts by weight of 2,2'-azobis-(N-butyl-2-methylpropionamide) (VAm-110, manufactured by Wako Pure Chemical Industries, Ltd.) was used as the component (C).

In addition, a photo-cured product was obtained by a method similar to that of Example 1 except that in Example 1, the photocurable composition (b-2) was used instead of using the photocurable composition (a-1). In this comparative example, the photocurable composition (film formed therefrom) was irradiated with light for 600 seconds in the light irradiation step. As a result, although being not observed 60 seconds after the start of the light irradiation, an interference pattern similar to that of Example 1 was observed over the entire surface 600 seconds after the start of the light irradiation.

In this comparative example, when the measurement of the mold releasing force was performed 600 seconds after the start of the light irradiation by a method similar to that in Example 1, the mold releasing force was at most 20 N or less (noise level).

Comparative Example 3

In Comparative Example 2, the photocurable composition was irradiated with UV rays for 240 seconds by a method similar to that of Example 1. An interference pattern similar to that in Example 1 was not observed. In this comparative example, when the mold releasing force was measured 240 seconds after the start of the light irradiation by a method similar to that of Example 1, the mold releasing force was 111 N.

Comparative Example 4

A photocurable composition (b-4) was prepared by a method similar to that of Example 1 except that in Example 1, the component (D) was not added.

The photocurable composition was irradiated with UV rays for 240 seconds by a method similar to that of Example 1. An interference pattern similar to that in Example 1 was not observed. In this comparative example, when the mold releasing force was measured 240 seconds after the start of the light irradiation by a method similar to that of Example 1, the mold releasing force was 187 N.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-223988, filed Oct. 9, 2012, which is hereby incorporated by reference herein in its entirety.

The invention claimed is:

1. A photocurable composition which can be cured using light while being in contact with a mold to manufacture a film, the photocurable composition comprising:

a polymerizable compound;

a photopolymerization initiator;

a fluorinated surfactant, and a photosensitive gas generating agent having a photostimulation responsive portion, wherein the photosensitive gas generating agent has a repeating structure including at least one alkylene oxide chain and generates a gas from the photostimulation responsive portion by light irradiation.

2. The photocurable composition according to claim 1, wherein the photosensitive gas generating agent includes a compound represented by the following general formula (3):

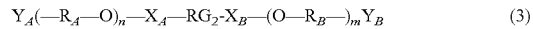

$$Y_A(-R_A-O)_n-X_A-RG_2-X_B-(O-R_B-)_m Y_B \quad (3)$$

where in the formula (3), $RG_2$ represents a divalent functional group functioning as the photostimulation responsive portion; $R_A$ and $R_B$ each represent a divalent alkylene group and are optionally identical to or different from each other; m and n are each an integer of 1 or more; $X_A$ and $X_B$ each represent a divalent linking group and are optionally identical to or different from each other;

and $Y_A$ and $Y_B$ each represent a monovalent substituent and are optionally identical to or different from each other.

3. The photocurable composition according to claim 1, wherein the alkylene oxide chain is an ethylene oxide chain.

4. The photocurable composition according to claim 1, wherein the photostimulation responsive portion includes a 2-diazo-1,2-naphthoquinone group.

5. The photocurable composition according to claim 1, wherein the photosensitive gas generating agent includes a compound represented by the following general formula (4):

[Chem. 1]

(4)

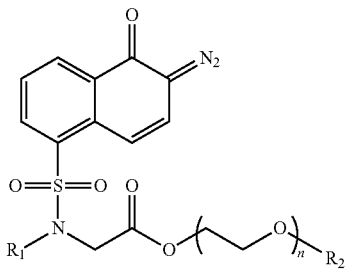

where in the formula (4), $R_1$ and $R_2$ each represent an alkyl group or a hydrogen atom and are optionally identical to or different from each other, and n is an integer of 1 or more.

6. The photocurable composition according to claim 1, wherein the photosensitive gas generating agent includes a compound represented by the following general formula (5):

[Chem. 2]

(5)

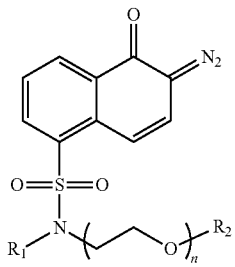

where in the formula (5), $R_1$ and $R_2$ each represent an alkyl group or a hydrogen atom and are optionally identical to or different from each other, and n is an integer of 1 or more.

7. The photocurable composition according to claim 1, wherein a blending rate of the photosensitive gas generating agent to the total amount of the polymerizable compound is 10 percent by weight or more, and
a blending rate of the fluorinated surfactant to the total amount of the polymerizable compound is 0.005 to 3 percent by weight.

8. An optical component comprising:
a substrate; and
a film having a predetermined pattern shape disposed on the substrate,
wherein the film is a film obtained by curing the photocurable composition according to claim 1.

9. A photocurable composition which can be cured using light while being in contact with a mold to manufacture a film, the photocurable composition comprising:
a polymerizable compound;
a photopolymerization initiator; and
a photosensitive gas generating agent having a photostimulation responsive portion,
wherein the photosensitive gas generating agent has a repeating structure including at least one alkylene oxide chain and generates a gas from the photostimulation responsive portion by light irradiation,
wherein the photosensitive gas generating agent includes a compound represented by the following general formula (2):

$$RG_1\text{-}X_A\text{—}(O\text{—}R_A\text{—})_n\text{—}X_B\text{—}RG_1' \qquad (2)$$

where in the formula (2), $RG_1$ and $RG_1'$ each represent a monovalent functional group functioning as the photostimulation responsive portion and are optionally identical to or different from each other; $X_A$ and $X_B$ each represent a divalent linking group and are optionally identical to or different from each other; $R_A$ represents a divalent alkylene group; and n is an integer of 1 or more.

10. The photocurable composition according to claim 9, wherein the alkylene oxide chain is an ethylene oxide chain.

11. The photocurable composition according to claim 9, wherein the photostimulation responsive portion includes a 2-diazo-1,2-naphthoquinone group.

12. The photocurable composition according to claim 9, wherein a blending rate of the photosensitive gas generating agent to the total amount of the polymerizable compound is 10 percent by weight or more, and a blending rate of a fluorinated surfactant to the total amount of the polymerizable compound is 0.005 to 3 percent by weight.

13. An optical component comprising:
a substrate; and
a film having a predetermined pattern shape disposed on the substrate,
wherein the film is a film obtained by curing the photocurable composition according to claim 9.

14. The photocurable composition according to claim 9, wherein the photocurable composition further comprises a fluorinated surfactant.

15. A method for manufacturing a film, the method comprising:
an arrangement step of arranging the photocurable composition according to claim 1 on a processing substrate;
a mold contact step of bringing the photocurable composition into contact with a mold;
a light irradiation step of irradiating the photocurable composition with light; and
a mold releasing step of releasing the mold from the photocurable composition after the light irradiation step so as to obtain a film having a predetermined pattern shape on the processing substrate.

16. The method for manufacturing a film according to claim 15, wherein the film has a thickness of 10 μm or less.

17. The method for manufacturing a film according to claim 15, wherein the mold in contact with the photocurable composition has a surface including quartz.

18. The method for manufacturing a film according to claim 15, wherein the light irradiation step is a step of irradiating the photocurable composition with light through the mold.

19. A method for manufacturing a circuited substrate, the method comprising:
performing etching or ion implantation based on the pattern shape of the film obtained by the method for manufacturing a film according to claim 15; and
forming a circuit structure in the processing substrate based on the pattern shape of the film.

* * * * *